(12) United States Patent
Sakai (10) Patent No.: US 7,450,395 B2
(45) Date of Patent: Nov. 11, 2008

(54) CIRCUIT MODULE AND CIRCUIT DEVICE INCLUDING CIRCUIT MODULE

(75) Inventor: Norio Sakai, Moriyama (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/100,479

(22) Filed: Apr. 10, 2008

(65) Prior Publication Data
US 2008/0180926 A1 Jul. 31, 2008

Related U.S. Application Data

(63) Continuation of application No. PCT/JP2006/317721, filed on Sep. 7, 2006.

(30) Foreign Application Priority Data
Oct. 20, 2005 (JP) .............................. 2005-305256

(51) Int. Cl.
*H05K 7/00* (2006.01)

(52) U.S. Cl. .................. 361/760; 361/783; 361/728; 361/761; 361/767; 361/768; 361/735; 361/736; 257/737

(58) Field of Classification Search ............... 361/760, 361/728, 761, 767, 768, 735, 736; 257/737, 257/685, 686, 781, 723, 784, 777
See application file for complete search history.

(56) References Cited

U.S. PATENT DOCUMENTS

| | | | | |
|---|---|---|---|---|
| 5,311,402 | A * | 5/1994 | Kobayashi et al. | ........... 361/760 |
| 5,375,042 | A * | 12/1994 | Arima et al. | ................ 361/784 |
| 6,225,686 | B1 | 5/2001 | Matsuura | |
| 6,313,521 | B1 * | 11/2001 | Baba | .......................... 257/678 |
| 6,744,137 | B2 * | 6/2004 | Kinsman | .................... 257/737 |
| 7,120,031 | B2 * | 10/2006 | Chakravorty et al. | ........ 361/762 |
| 2002/0101723 | A1 * | 8/2002 | Bertin et al. | ................ 361/736 |

(Continued)

FOREIGN PATENT DOCUMENTS

JP 06-216314 A 8/1994

(Continued)

OTHER PUBLICATIONS

Official communication issued in the International Application No. PCT/JP2006/317721, mailed on Nov. 14, 2006.

*Primary Examiner*—Jeremy C Norris
*Assistant Examiner*—Hoa C Nguyen
(74) *Attorney, Agent, or Firm*—Keating & Bennett, LLP (57) ABSTRACT

A circuit module includes connection electrodes on a plate-shaped board and connection electrodes on a frame-shaped board that are bonded together with conductive bonding materials there between. Circuit components are provided in portions of a surface of the plate-shaped board, the portions being located inward relative to the frame-shaped board. A sealing resin is filled and cured in a cavity, which is defined by the frame-shaped board and the plate-shaped board. Since the center of each of the connection electrodes on the frame-shaped board is inwardly displaced relative to the center of a corresponding one of the connection electrodes on the plate-shaped board by α, a curing contraction stress of the sealing resin is mitigated by a curing contraction stress of the conductive bonding materials. Thus, deformation of the frame-shaped board is suppressed.

8 Claims, 5 Drawing Sheets

U.S. PATENT DOCUMENTS

| | | |
|---|---|---|
| 2002/0121708 A1 | 9/2002 | Matsuura |
| 2002/0139571 A1* | 10/2002 | Mizunashi ................... 174/255 |
| 2004/0118604 A1* | 6/2004 | Dory et al. ................... 174/262 |
| 2006/0202322 A1* | 9/2006 | Kariya et al. ............... 257/698 |
| 2006/0237225 A1* | 10/2006 | Kariya et al. ............... 174/260 |
| 2006/0267190 A1* | 11/2006 | Terada et al. ................ 257/723 |
| 2007/0171619 A1* | 7/2007 | Akita et al. .................. 361/736 |

FOREIGN PATENT DOCUMENTS

| | | |
|---|---|---|
| JP | 07-050357 A | 2/1995 |
| JP | 2000-101348 A | 4/2000 |
| JP | 2001-339137 A | 12/2001 |
| JP | 2003-142634 A | 5/2003 |

* cited by examiner

CIRCUIT MODULE AND CIRCUIT DEVICE INCLUDING CIRCUIT MODULE

BACKGROUND OF THE INVENTION

1. Field of the Invention

The present invention relates to a circuit module in which a plate-shaped board and a frame-shaped board are bonded together and to a circuit device including the circuit module.

2. Description of the Related Art

Circuit modules having higher packaging densities and a reduced size are described in Japanese Unexamined Patent Application Publication No. 6-216314, Japanese Unexamined Patent Application Publication No. 7-50357, Japanese Unexamined Patent Application Publication No. 2000-101348, and Japanese Unexamined Patent Application Publication No. 2001-339137. In such circuit modules, a plurality of connection electrodes is provided on a surface of a plate-shaped board, such as a ceramic board, and a plurality of connection electrodes, which correspond to the plurality of connection electrodes provided on the surface of the plate-shaped board, is provided on a surface of a frame-shaped board made of resin or other suitable material. The surface of the plate-shaped board faces the surface of the frame-shaped board. The connection electrodes on the plate-shaped board and the connection electrodes on the frame-shaped board are bonded together using conductive bonding materials, such as solder. Circuit components, such as semiconductor elements, are provided on portions of the surface of the plate-shaped board, the portions being located inward relative to the frame-shaped board. A sealing resin is filled in a cavity defined by an inner surface of the frame-shaped board and the surface of the plate-shaped board such that the sealing resin covers the circuit components.

The sealing resin is filled in the cavity to protect the circuit components provided on the plate-shaped board (i.e., to prevent short-circuiting caused by wire deformation when the circuit components are connected to the plate-shaped board by wire bonding and to prevent short-circuiting or other damage caused by foreign matter entering into a space between terminals when a bare chip or a flip chip is used) and to improve the mechanical strength of the circuit module. For the sealing resin, a thermosetting resin, such as an epoxy resin, is commonly used.

When the sealing resin is filled in the cavity and then heat curing is performed, the resin contracts at a specific rate. This contraction stress is also exerted on the frame-shaped board, and a force drawing the frame-shaped board inwardly is generated. The Young's modulus of ceramic is in the range of about 100 GPa to about 300 GPa, whereas, the Young's modulus of resin is in the range of about 10 GPa to about 60 GPa. Thus, although the plate-shaped board, which is a ceramic board, is not substantially deformed, the frame-shaped board made of resin is likely to be deformed. In recent years, a further reduction in the size of a circuit module has been required. Since the width of a frame-shaped board is very small, such as several hundred micrometers, deformation has been more likely to occur. As a result, a problem of inward deformation of the frame-shaped board due to the contraction stress of a sealing resin is likely to occur.

SUMMARY OF THE INVENTION

To overcome the problems described above, preferred embodiments of the present invention provide a circuit module which suppresses inward deformation of a frame-shaped board, the inward deformation being caused by contraction stress occurring when a sealing resin is filled and cured in a cavity defined by a plate-shaped board and the frame-shaped board, and provide a circuit device including such a circuit module.

A circuit module according to a preferred embodiment of the present invention includes a plate-shaped board having a plurality of connection electrodes arranged in peripheral portions of a first main surface of the plate-shaped board, and a frame-shaped board having a plurality of connection electrodes arranged on a first main surface of the frame-shaped board corresponding to the plurality of connection electrodes arranged in the peripheral portions of the first main surface of the plate-shaped board. The plurality of connection electrodes on the plate-shaped board and the plurality of connection electrodes on the frame-shaped board are connected to each other with conductive bonding materials. Circuit components are accommodated in a cavity defined by an inner surface of the frame-shaped board and the first main surface of the plate-shaped board. A sealing resin is filled and cured in the cavity such that the sealing resin covers the circuit components. The center of each of the plurality of connection electrodes on the frame-shaped board is displaced in an inward direction of the frame-shaped board relative to the center of a corresponding one of the plurality of connection electrodes on the plate-shaped board.

In a circuit module according to the related art, when bonding materials, such as solder or conductive adhesives, for bonding the plate-shaped board and the frame-shaped board together are cured, in order to avoid a non-uniform application of stress, the connection electrodes on the plate-shaped board and the connection electrodes on the frame-shaped board are arranged so as to precisely oppose each other. That is, the position of the center of each of the connection electrodes on the plate-shaped board corresponds to the position of the center of a corresponding one of the connection electrodes on the frame-shaped board. However, according to preferred embodiments of the present invention, the center of each of the connection electrodes on the frame-shaped board is displaced in an inward direction of the frame-shaped board relative to the center of a corresponding one of the connection electrodes on the plate-shaped board. When a sealing resin is filled and cured in the cavity defined by the plate-shaped board and the frame-shaped board, a curing contraction stress F1 of the sealing resin is exerted on the frame-shaped board such that the frame-shaped board is drawn inwardly, similar to the related art. However, a curing contraction stress F2 of the conductive bonding materials, which are provided between the connection electrodes on the frame-shaped board and the connection electrodes on the plate-shaped board, occurs. Since the center of each of the connection electrodes on the frame-shaped board is inwardly displaced relative to the center of a corresponding one of the connection electrodes on the plate-shaped board, the stress F2 is applied such that the connection electrodes on the frame-shaped board is drawn outwardly. As a result, the contraction stress F1 of the sealing resin is mitigated by the contraction stress F2 of the conductive bonding materials. Thus, the influence of the contraction stress F1 of the sealing resin is reduced. In other words, the stress F2 of the bonding materials is applied in advance, so that the stress F1 occurring when the resin is cured is suppressed. As a result, deformation of the frame-shaped resin is suppressed, and the reliability in the connection between the connection electrodes on the frame-shaped board and the connection electrodes on the plate-shaped board is improved. The term "plate-shaped board", as used herein, means a board having one plane on which a plurality of connection electrodes to be connected to a frame-shaped board is provided.

Protrusions or recesses may be provided in portions that are different from planar portions to which the frame-shaped board is to be connected.

Preferably, an inner edge of each of the plurality of connection electrodes on the frame-shaped board is displaced in the inward direction of the frame-shaped board relative to an inner edge of a corresponding one of the plurality of connection electrodes on the plate-shaped board. As described above, when the inner edge of each of the connection electrodes on the frame-shaped board is inwardly displaced relative to the inner edge of a corresponding one of the connection electrodes on the plate-shaped board, a bonding material, such as solder, is cured such that the bonding material extends in width directions between one of the connection electrode on the frame-shaped board and the connection electrode on the plate-shaped board and the other one of the connection electrode on the frame-shaped board and the connection electrode on the plate-shaped board. Thus, the contraction stress F2 can be increased. As a result, the contraction stress F1 of the sealing resin can be more effectively mitigated by the contraction stress F2 of the conductive bonding material. According to preferred embodiments of the present invention, the center of each of the connection electrodes on the frame-shaped board can be inwardly displaced relative to the center of a corresponding one of the connection electrodes on the plate-shaped board. It is not necessary that the inner edge of each of the connection electrodes on the frame-shaped board is inwardly displaced relative to the inner edge of a corresponding one of the connection electrodes on the plate-shaped board. For example, when the width of the connection electrodes on the plate-shaped board is greater than the width of the connection electrodes on the frame-shaped board, the position of the inner edge of each of the connection electrodes on the plate-shaped board may correspond to the position of the inner edge of a corresponding one of the connection electrodes on the frame-shaped board or the position of the inner edge of each of the connection electrodes on the plate-shaped board may be inwardly displaced from the position of the inner edge of a corresponding one of the connection electrodes on the frame-shaped board.

Preferably, the plurality of connection electrodes in the peripheral portions of the first main surface of the plate-shaped board has a frame shape, the plurality of connection electrodes on the first main surface of the frame-shaped board has a frame shape, and the center of each of the plurality of connection electrodes on the frame-shaped board is displaced in an inward direction of the frame-shaped board relative to the center of a corresponding one of the plurality of connection electrodes on the plate-shaped board. The connection electrodes on the plate-shaped board and the connection electrodes on the frame-shaped board may be arranged on two opposed sides. Alternatively, the connection electrodes on the plate-shaped board and the connection electrodes on the frame-shaped board may have a frame shape (that is, on four sides). Even when the connection electrodes have a frame shape, the positions of the connection electrodes on two opposed sides of the plate-shaped board are displaced from the positions of the connection electrodes on the corresponding two sides of the frame-shaped board. Alternatively, the positions of the connection electrodes on the four sides of the plate-shaped board may be displaced from the positions of the connection electrodes on the corresponding four sides of the frame-shaped board. When the positions of the connection electrodes on the four sides of the plate-shaped board are displaced from the positions of the connection electrodes on the corresponding four sides of the frame-shaped board, the contraction stress F1 of the sealing resin is mitigated by the contraction stress F2 of the conductive bonding materials on all four sides of the frame-shaped board. Thus, the deformation of the frame-shaped board is effectively suppressed.

Preferably, the plate-shaped board is a ceramic board and the frame-shaped board is a resin board. Although both the plate-shaped board and the frame-shaped board may be ceramic boards or resin boards, when the plate-shaped board is a ceramic board and the frame-shaped board is a resin board, the mechanical strength of the plate-shaped board is high. Thus, deformation caused by the sealing resin can be prevented, and thermal cycle reliability can be increased when the frame-shaped board is made of resin. In addition, when a ceramic multilayer board is used as a plate-shaped board, a complicated circuit can be provided within the board. Thus, the circuit density can be increased.

Different circuit components may be provided on a second main surface of the plate-shaped board, which is opposite to the first main surface of the plate-shaped board. In this case, since circuit components can be provided on both surfaces of the plate-shaped board, the packaging density can be increased. As such circuit components, surface mount components to be surface-mounted on the plate-shaped board using solder or other suitable adhesive may be used. Alternatively, integrated circuit components that are arranged face up and wire bonded may be used. Alternatively, circuit components that are arranged face down using bumps may be used.

Preferably, a plurality of terminal electrodes, which are connected to the plurality of connection electrodes on the frame-shaped board with interlayer connection conductors therebetween, are provided on a second main surface of the frame-shaped board, which is opposite to the first main surface of the frame-shaped board. In this case, when the circuit module is provided on a motherboard, terminal electrodes must be provided. However, since the terminal electrodes are provided on the second main surface, which is opposite to the first main surface of the frame-shaped board, the plate-shaped board can be maintained at a position remote from the motherboard. Thus, the influence of stress and heat transmission from the motherboard to the plate-shaped board can be suppressed by the frame-shaped board. Via-hole conductors in the frame-shaped board, through-holes, or pattern electrodes provided on an outer or inner surface of the frame-shaped board may be used as interlayer connection conductors.

In a circuit device in which a circuit module, including a plurality of terminal electrodes provided on a second main surface of a frame-shaped board, is provided on a main surface of a motherboard with conductive bonding materials, a plurality of surface electrodes, which correspond to the plurality of terminal electrodes on the frame-shaped board, are provided on the main surface of the motherboard, and the center of each of the plurality of terminal electrodes on the frame-shaped board is displaced in an inward direction of the frame-shaped board relative to the center of a corresponding one of the plurality of surface electrodes on the motherboard. As described above, due to the positional relationship between the connection electrodes on the frame-shaped board and the connection electrodes on the plate-shaped board, the contraction stress F1 of the sealing resin is mitigated by the contraction stress F2 of the conductive bonding materials. However, the contraction stress F1 of the sealing resin is not necessarily completely eliminated. Thus, since the center of each of the terminal electrodes on the frame-shaped board is inwardly displaced relative to the center of a corresponding one of the surface electrodes on the motherboard, stress F3, which is in the same direction as the contraction stress F2 of the conductive bonding materials, is also generated by conductive bonding materials used to mount the circuit module on the motherboard. Thus, the contraction stress F1 of the sealing resin is more effectively mitigated.

Preferably, the plurality of terminal electrodes on the second main surface of the frame-shaped board have a frame shape, the plurality of surface electrodes on the main surface of the motherboard have a frame shape, and the center of each of the plurality of terminal electrodes on the frame-shaped board is displaced in an inward direction of the frame-shaped board relative to the center of a corresponding one of the plurality of surface electrodes on the motherboard. In this case, similar to the relationship between the connection electrodes on the plate-shaped board and the connection electrodes on the frame-shaped board, when the positions of the surface electrodes on the four sides of the motherboard are displaced from the positions of the terminal electrodes on the corresponding four sides of the frame-shaped board, the contraction stress F3 of the conductive bonding materials is applied to all the four sides of the frame-shaped board. Thus, deformation of the frame-shaped board is effectively suppressed.

As described above, according to a preferred embodiment of the present invention, since the center of each of the connection electrodes on the frame-shaped board is inwardly displaced relative to the center of a corresponding one of the connection electrodes on the plate-shaped board, the curing contraction stress F2 of the conductive bonding materials, which are provided between the connection electrodes on the frame-shaped board and the connection electrodes on the plate-shaped board, is applied in a direction such that the frame-shaped board is displaced outwardly. Thus, the contraction stress F1 of the sealing resin is mitigated. As a result, the influence of the contraction stress F1 of the sealing resin is reduced. Thus, the deformation of the frame-shaped board is suppressed, and the reliability in the connection between the connection electrodes on the frame-shaped board and the connection electrodes on the plate-shaped board is improved.

Other features, elements, processes, steps, characteristics and advantages of the present invention will become more apparent from the following detailed description of preferred embodiments of the present invention with reference to the attached drawings.

DETAILED DESCRIPTION OF THE PREFERRED EMBODIMENTS

First Preferred Embodiment

Figure 1:
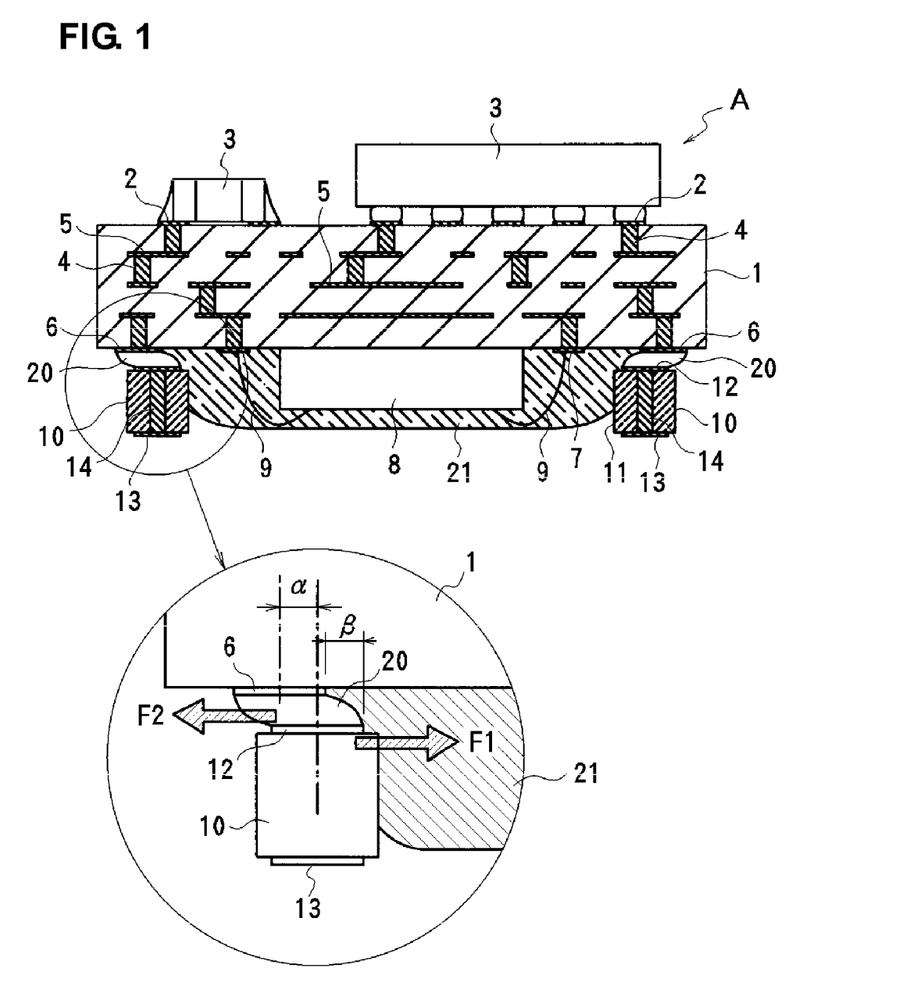
FIG. 1 is a cross-sectional view of a circuit module according to a preferred embodiment of the present invention.
Figure 2:
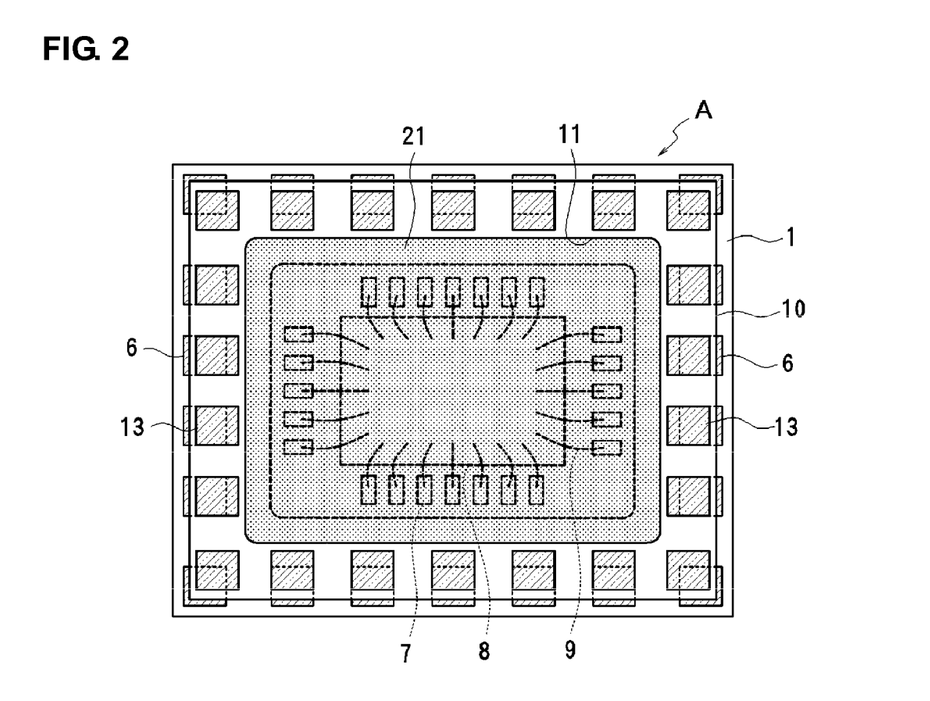
FIG. 2 is a bottom view of the circuit module shown in FIG. 1.

FIGS. 1 and 2 show a circuit module according to a first preferred embodiment of the present invention. A circuit module A includes a plate-shaped board (hereinafter, referred to as a wiring board) 1 and a frame-shaped board (hereinafter, referred to as a terminal board) 10 that are bonded together.

The wiring board 1 is a ceramic multilayer board including a plurality of stacked ceramic layers made of, for example, LTCC (Low-Temperature Co-firable Ceramic: low-temperature sintering ceramic) or other suitable ceramic material. A plurality of land electrodes 2 are provided on a second main surface, and a plurality of circuit components 3 are connected above the plurality of land electrodes 2. Electrode patterns, which are primarily made of silver or copper, are provided on an outer layer or an inner layer of the wiring board 1 to define passive element patterns, such as capacitors or inductors, and wiring patterns arranged to connect the circuit components 3 to the passive elements. The circuit components 3 include a combination of surface-mount components, such as multilayer ceramic capacitors, which are soldered to the land electrodes 2, and surface-mount components, such as semiconductor devices, which are face-down mounted on the land electrodes 2 through bumps. However, the circuit components 3 are not necessarily of this type. The land electrodes 2 are connected to a plurality of connection electrodes 6 or a plurality of pad electrodes 7, which are provided on a first main surface, through via-hole conductors 4 and internal wires 5 provided inside the wiring board 1. The connection electrodes 6 have a frame shape in peripheral portions of the first main surface of the wiring board 1. The pad electrodes 7 are provided in regions located inward relative to the connection electrodes 6, which preferably have the frame shape. The pad electrodes 7 are connected to circuit components 8, such as integrated circuit elements, provided on the first main surface of the wiring board 1 via bonding wires 9. Although the integrated circuit elements 8 are provided on the first main surface of the wiring board 1 in this example, surface-mount components, such as multilayer ceramic capacitors, or face-down mount components, such as semiconductor devices, may be provided on the first main surface of the wiring board 1.

A terminal board 10 is a resin board having a frame shape. The outer dimensions of the terminal board 10 are slightly less than the outer dimensions of the wiring board 1. A plurality of connection electrodes 12 have a frame shape on a first main surface of the terminal board 10, which faces the first main surface of the wiring board 1. As shown in FIG. 1, the center of each of the plurality of connection electrodes 12 is inwardly displaced relative to the center of a corresponding one of the plurality of connection electrodes 6 on the wiring board 1 by α. An inner edge of each of the connection electrodes 12 is inwardly displaced relative to an inner edge of a corresponding one of the connection electrodes 6 by β. When the connection electrodes 12 and the connection electrodes 6 have the same shape, the value α should be approximately equal to the value β. However, when the width of the connection electrodes 6 is greater than the width of the connection electrodes 12 (the dimension in a horizontal direction of the connection electrodes 6 is greater than the dimension in the horizontal direction of the connection electrodes 12 in FIG. 1), the value α is greater than the value β. The connection electrodes 6 on the wiring board 1 and the connection electrodes 12 on the terminal board 10 are electrically connected and mechanically bonded to each other with conductive bonding materials 20, such as solder or a conductive adhesive. Since there is a displacement α between the center of each of the connection electrodes 12 and the center of a corresponding one of the connection electrodes 6, the bonding materials 20 are cured in a state in which the bonding materials 20 extend inwardly and outwardly. Thus, an outward curing contraction stress F2 is exerted on the connection electrodes 12 on the terminal board 10, as represented by an arrow. Here, a force that reacts against the stress F2 is generated. The reactive force is concentrated at corners of the terminal board 10, and the stress F2 remains in the wall portions of the frame-shaped terminal board 10. Preferably, the center of each of the connection electrodes 12 on the terminal board 10 is located within a projection plane of a corresponding one of the connection electrodes 6 on the wiring board 1. When the center of the connection electrode 12 is located outside the projection plane of the connection electrode 6, when connecting the wiring board 1 to the terminal board 10, the stress on the bonding material 20 is too large, and the bonding strength between the terminal board 10 and the wiring board 1 may be reduced.

On a second main surface of the terminal board 10, a plurality of terminal electrodes 13, which correspond to the connection electrodes 12, have a frame shape. The connection electrodes 12 and the terminal electrodes 13 are connected to each other through via-hole conductors 14, which extend through the terminal board 10 in a thickness direction of the terminal board 10. In this example, the connection electrodes 12 and the terminal electrodes 13 have the same shape. In addition, the connection electrodes 12 and the terminal electrodes 13 are disposed at the same positions on the front and rear main surfaces of the terminal board 10. Interlayer connection conductors, which connect the connection electrodes 12 and the terminal electrodes 13 together, are not necessarily the via-hole conductors 14. The interlayer connection conductors may be connection pattern electrodes provided on an outer surface or an inner surface of the terminal board 10 or through-hole conductors. Through-hole conductors are arranged such that electrodes are provided on inner surfaces of holes passing through the terminal board 10 in the thickness direction of the terminal board 10. It is particularly preferable that the interlayer connection conductors are sheet conductors, which are formed by bending metal sheets, and that the terminal board 10 is a molded resin terminal board formed by molding the sheet conductors with resin. When the interlayer connection conductors are formed by bending metal sheets, even if stress is exerted on the terminal board 10, breakage of the interlayer connection conductors does not occur. Thus, connection reliability is ensured.

Due to the bonding of the terminal board 10 and the wiring board 1 with the conductive bonding materials 20, a cavity 11 is defined. The thickness of the terminal board 10 and the bonding materials 20 is set to be greater than the height of the circuit components 8 and the bonding wires 9 provided on the first main surface of the wiring board 1. A sealing resin 21 is filled and cured in the cavity 11, which is defined by the terminal board 10 and the wiring board 1. The entire circuit components 8 and the bonding wires 9 are buried in the sealing resin 21. Since the thickness of the terminal board 10 and the bonding materials 20 is greater than the height of the circuit components 8 and the bonding wires 9, a surface of the sealing resin 21 does not protrude from the terminal board 10. Due to the curing of the sealing resin 21, an inward curing contraction stress F1 is exerted on the terminal board 10, as shown in FIG. 1. However, since the outward curing contraction stress F2 of the bonding materials 20 is applied as described above, the curing contraction stress F1 of the sealing resin 21 is mitigated by the curing contraction stress F2 of the bonding materials 20, thus reducing the influence of the contraction stress F1 of the sealing resin on the terminal board 10. As a result, deformation of the terminal board 10 is reduced, and the connection reliability of the connection electrodes 6 and the connection electrodes 12 is improved. In addition, due to a tensile stress of the bonding materials 20 or a curing contraction stress of the sealing resin 21, contraction stress is exerted on the ceramic multilayer board defining the wiring board 1 in an inward and direction towards to center. Thus, the mechanical strength of the wiring board 1 itself is also increased.

When the wiring board 1 is bonded to the terminal board 10, the plurality of bonding materials 20 are located between the wiring board 1 and the terminal board 10 and gaps are provided between adjacent bonding materials 20. When filling of the sealing resin 21 is performed, if the sealing resin 21 flows through the gaps between the bonding materials 20, an appearance defect or a connection failure caused by the sealing resin that flows to the periphery may be generated. Thus, the sealing resin 21 is made of a mixed resin composition of a thermosetting resin and an inorganic filler and is adjusted to have a sufficient viscosity such that the sealing resin 21 does not flow through the gaps between the bonding materials 20. Here, when the sealing resin 21 is made of a mixed resin composition of a thermosetting resin and an inorganic filler, the heat resistance, the moisture resistance, the thermal coefficient expansion, and the curing contraction stress F1, as well as the degree of viscosity, can be adjusted based on the percentage content of the inorganic filler. As a thermosetting resin, for example, an epoxy resin, a phenolic resin, a cyanate resin, or other suitable resin having an excellent thermal resistance and an excellent moisture resistance can be used. In addition, as an inorganic filler, for example, alumina, silica, or titania can be used.

Figure 3A:
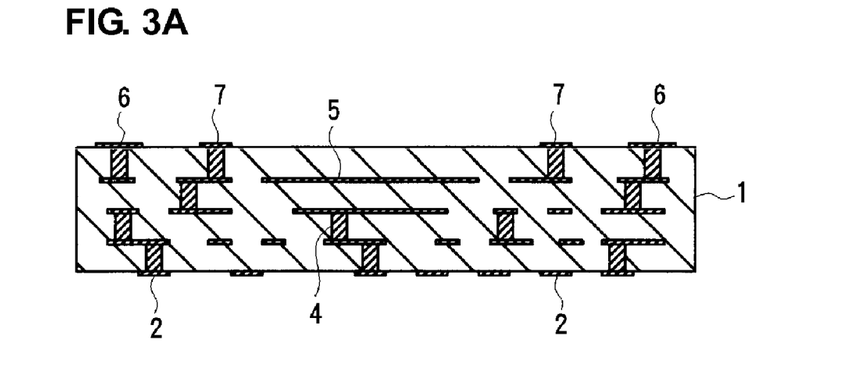
FIGS. 3A to 3C include process drawings showing the first half of a method for producing the circuit module shown in FIG. 1.
Figure 3B:
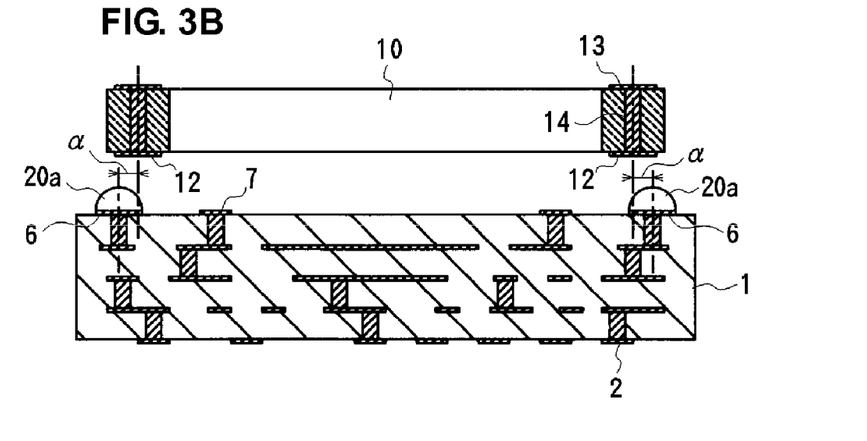
Figure 3C:
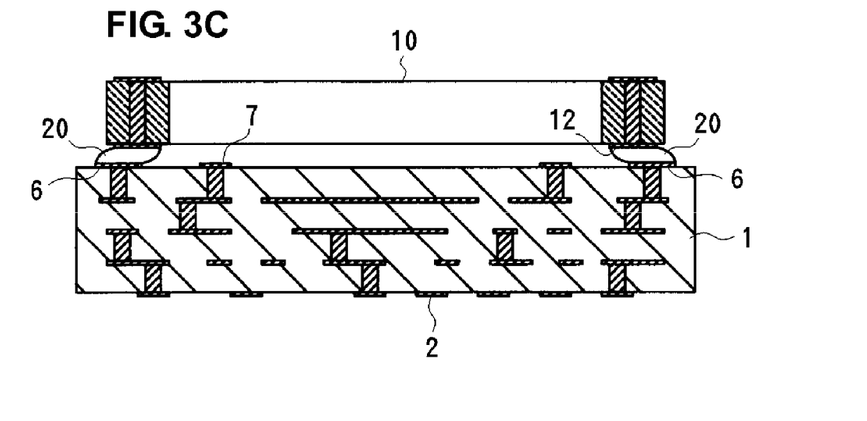

A method for producing the circuit module A will be described with reference to FIGS. 3A to 4C. FIG. 3A illustrates a state in which the wiring board 1 is prepared. Here, the connection electrodes 6 and the pad electrodes 7 are arranged so as to be directed toward the upper side of the wiring board 1. FIG. 3B illustrates a state in which solder pastes 20a are applied on the connection electrodes 6 on the wiring board 1 and the terminal board 10 is provided over the solder pastes 20a. Each of the connection electrodes 12 on the terminal board 10 is located in a position that is inwardly displaced relative to a corresponding one of the connection electrodes 6 on the wiring board 1 by α. Then, reflow soldering is performed. FIG. 3C illustrates a state in which melting and curing of the solder pastes 20a and soldering are completed. When the melting and curing of the solder pastes 20a is performed, the terminal board 10 is automatically stabilized at a balanced center position due to the surface tension of solder. That is, since uniform surface tension is exerted on the solder pastes 20a provided on the entire circumference, the terminal board 10 is bonded to the wiring board 1 without being biased to one side.

Figure 4A:
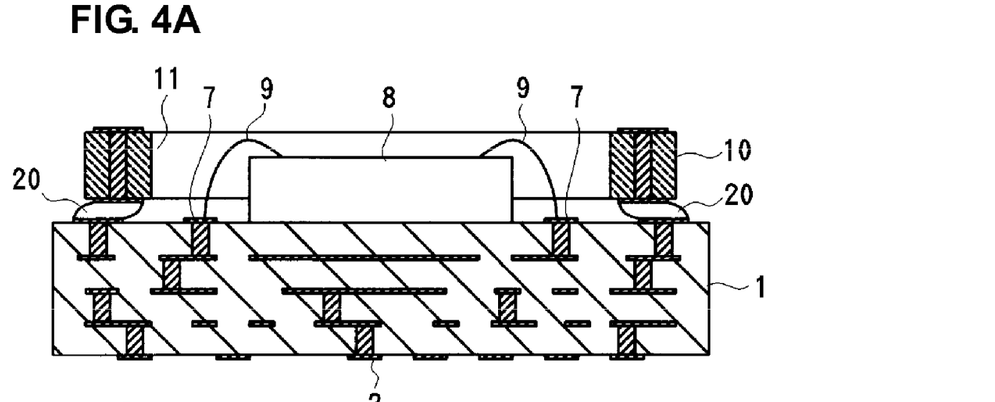
FIGS. 4A to 4C include process drawings showing the last half of the method for producing the circuit module shown in FIG. 1.
Figure 4B:
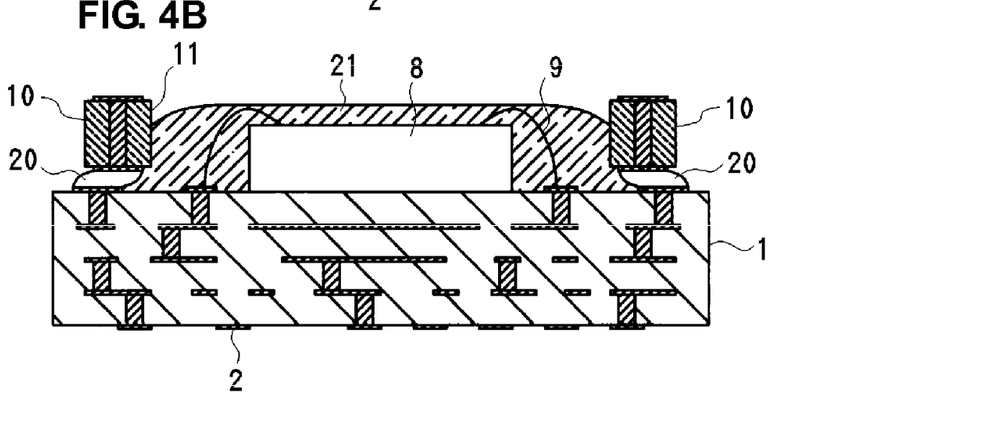
Figure 4C:
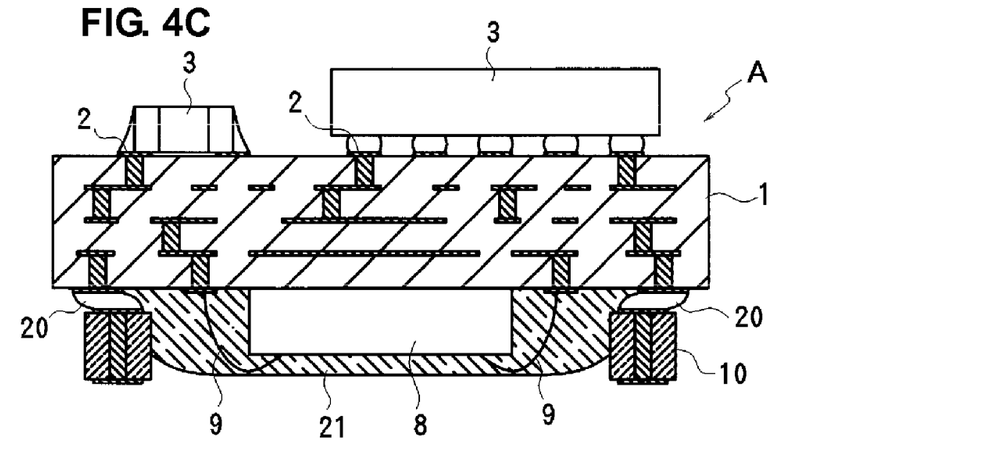

FIG. 4A illustrates a state in which the circuit components 8 are provided at portions of the first main surface of the wiring board 1, the portions being surrounded by the terminal board 10, and the circuit components 8 and the pad electrodes 7 are connected through the bonding wires 9. FIG. 4B illustrates a state in which the sealing resin 21 is filled in the cavity 11 defined by the terminal board 10 and the wiring board 1. The sealing resin 21 is set to have a sufficient viscosity such that the sealing resin 21 can easily flow through the gaps between the bonding wires 9 and around the circuit components 8 but does not flow outside through the gaps between the bonding materials 20. Then, thermosetting of the sealing resin 21 is performed. Here, curing contraction of the sealing resin 21 occurs, and the stress F1 is generated as shown in FIG. 1. However, since the stress F2, which is opposite to the stress F1, is applied by the conductive bonding materials 20, the stress F1 is mitigated by the stress F2. Thus, deformation of the terminal board 10 is suppressed. Finally, as shown in FIG. 4C, the circuit components 3 are connected to the land electrodes 2, which are provided on the rear side of the wiring board 1, and the circuit module A is completed.

Figure 5:
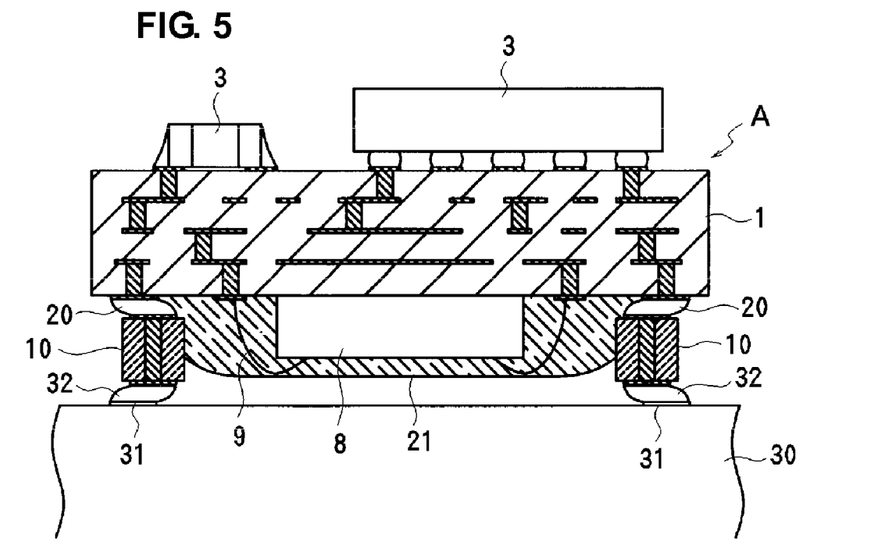
FIG. 5 is a cross-sectional view of a circuit device in which the circuit module shown in FIG. 1 is mounted on a motherboard.
Figure 6:
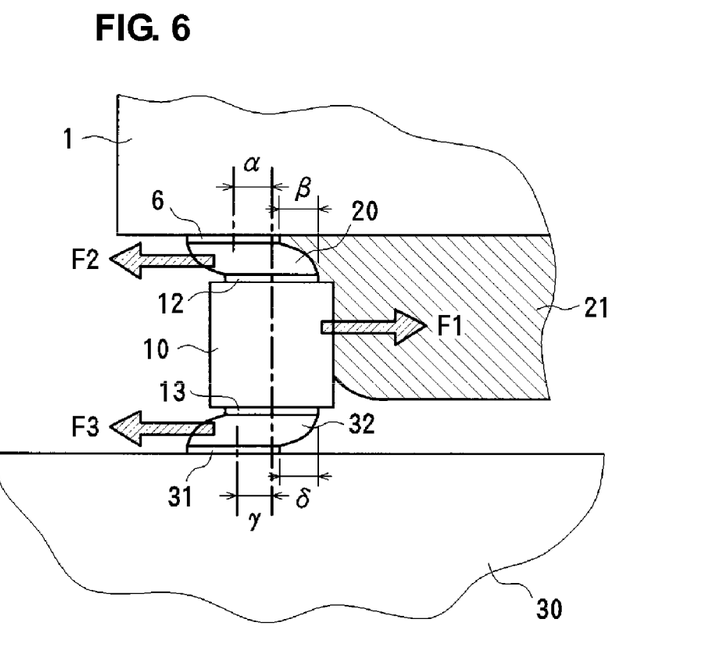
FIG. 6 is an enlarged view showing an essential portion of FIG. 5.

FIGS. 5 and 6 illustrate a state in which the circuit module A is mounted on a motherboard 30. On a surface of the motherboard 30, such as a printed wiring board, a plurality of surface electrodes 31 have a frame shape. The surface electrodes 31 and the terminal electrodes 13 on the terminal board 10 are electrically connected and mechanically bonded to each other with conductive bonding materials 32, such as solder or conductive adhesives. As shown in FIG. 6, the center of each of the surface electrodes 31 is outwardly displaced relative to the center of a corresponding one of the terminal electrodes 13 on the terminal board 10 by γ. In this example, since the terminal electrodes 13 and the surface electrodes 31 have the same shape, the inner edge of each of the terminal electrodes 13 is inwardly displaced relative to the inner edge of a corresponding one of the surface electrodes 31 by δ. Thus, the bonding materials 32 are cured such that the bonding materials 32 extend in inward and outward directions of the terminal board 10, and outward curing contraction stress F3 is exerted on the terminal electrodes 13, as represented by an arrow.

When the circuit module A is mounted on the motherboard 30 as described above, the outward stress F2 is exerted on the connection electrodes 12 due to the bonding materials 20, which bond the wiring board 1 and the terminal board 10 together, the inward stress F1 is exerted on the terminal board 10 due to the curing of the sealing resin 21, and the outward stress F3 is exerted on the terminal electrodes 13 due to the bonding materials 32, which bond the circuit module A and the motherboard 30 together. That is, since the outward stress F2 and the outward stress F3 mitigate the inward stress F1, which is exerted on the terminal board 10, the stress exerted on the terminal board 10 is reduced. Thus, deformation of the terminal board 10 is prevented or suppressed.

In the above-described preferred embodiment, a configuration in which the wiring board 1 in a slave-board state is prepared and the terminal board 10 is bonded to the wiring board 1 has been described. However, the wiring board 1 in an integrated board state may be prepared. A plurality of terminal boards 10 may be bonded to the wiring board 1 in the integrated board state, and after providing the circuit components 8 and filling the sealing resin 21, the wiring board 1 in the integrated board state may be divided into slave boards. Since the outer dimensions of the terminal boards 10 are less than the outer dimensions of the wiring board 1, each of the terminal boards 10 can be provided on the wiring board 1 in the integrated board state. In addition, when an integrated board is divided into slave boards, the division may be performed by cutting using a dicing machine or by chocolate bar breaking. The wiring board used in preferred embodiments of the present invention has a plate shape. However, the wiring board having a plate shape is not required to have a completely planar surface. The wiring board having a plate shape may have a surface provided with shallow recesses or protrusions. For example, as described in Japanese Unexamined Patent Application Publication No. 6-216314, shallow recesses may be provided in a wiring board so that circuit components are provided in the shallow recesses. In each of the above-described preferred embodiments, the connection electrodes on the wiring board and the connection electrodes on the terminal board preferably have frame shapes, that is, they are arranged to extend along all four sides. However, the connection electrodes on the wiring board and the connection electrodes on the terminal board may be arranged on two or three sides of the wiring board and on two or three corresponding sides of the terminal board. In this case, on the two or three sides, the center of each of the connection electrodes on the terminal board can be inwardly displaced relative to the center of a corresponding one of the connection electrodes on the wiring board.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A circuit module comprising:
   a plate-shaped board including a plurality of connection electrodes arranged at peripheral portions of a first main surface of the plate-shaped board; and
   a frame-shaped board including a plurality of connection electrodes arranged on a first main surface of the frame-shaped board, the plurality of connection electrodes arranged on the first main surface of the frame-shaped board corresponding to the plurality of connection electrodes arranged at the peripheral portions of the first main surface of the plate-shaped board; wherein
   the plurality of connection electrodes on the plate-shaped board and the plurality of connection electrodes on the frame-shaped board are connected to each other;
   circuit components are accommodated in a cavity defined by an inner surface of the frame-shaped board and the first main surface of the plate-shaped board;
   a sealing resin is filled and cured in the cavity such that the sealing resin covers the circuit components; and
   an approximate center of each of the plurality of connection electrodes on the frame-shaped board is displaced in an inward direction of the frame-shaped board relative to an approximate center of a corresponding one of the plurality of connection electrodes on the plate-shaped board.

2. The circuit module according to claim 1, wherein an inner edge of each of the plurality of connection electrodes on the frame-shaped board is displaced in the inward direction of the frame-shaped board relative to an inner edge of a corresponding one of the plurality of connection electrodes on the plate-shaped board.

3. The circuit module according to claim 1, wherein
   the plurality of connection electrodes in the peripheral portions of the first main surface of the plate-shaped board have a frame shape;
   the plurality of connection electrodes on the first main surface of the frame-shaped board have a frame shape; and
   the approximate center of each of the plurality of connection electrodes on the frame-shaped board is displaced in an inward direction of the frame-shaped board relative to the approximate center of a corresponding one of the plurality of connection electrodes on the plate-shaped board.

4. The circuit module according to claim 1, wherein the plate-shaped board is a ceramic board and the frame-shaped board is a resin board.

5. The circuit module according to claim 1, wherein different circuit components are provided on a second main surface of the plate-shaped board, which is opposite to the first main surface of the plate-shaped board.

6. The circuit module according to claim 1, wherein a plurality of terminal electrodes, which are connected to the plurality of connection electrodes on the frame-shaped board with interlayer connection conductors therebetween, are provided on a second main surface of the frame-shaped board, which is opposite to the first main surface of the frame-shaped board.

7. A circuit device comprising:

a motherboard; and the circuit module according to claim 6 mounted on a main surface of the motherboard with conductive bonding materials; wherein a plurality of surface electrodes, which correspond to the plurality of terminal electrodes on the frame-shaped board, are provided on the main surface of the motherboard; and an approximate center of each of the plurality of terminal electrodes on the frame-shaped board is displaced in an inward direction of the frame-shaped board relative to an approximate center of a corresponding one of the plurality of surface electrodes on the motherboard.

8. The circuit device according to claim 7, wherein the plurality of terminal electrodes on the second main surface of the frame-shaped board have a frame shape;

the plurality of surface electrodes on the main surface of the motherboard have a frame shape; and the approximate center of each of the plurality of terminal electrodes on the frame-shaped board is displaced in an inward direction of the frame-shaped board relative to the approximate center of a corresponding one of the plurality of surface electrodes on the motherboard.

\* \* \* \* \*